United States Patent
Haridy et al.

(10) Patent No.: US 9,602,055 B1
(45) Date of Patent: Mar. 21, 2017

(54) SINGLE-ENDED MIXER WITH REDUCED LOSS

(71) Applicant: Analog Devices Global, Hamilton (BM)

(72) Inventors: Omar Fathy M. Haridy, Cairo (EG); Peter John Katzin, Arlington, MA (US); Ahmed Adel Hassona, Alexandria (EG)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/008,183

(22) Filed: Jan. 27, 2016

(51) Int. Cl.
- *H04B 1/26* (2006.01)
- *H03D 7/14* (2006.01)
- *H01L 21/8234* (2006.01)
- *H01L 23/66* (2006.01)

(52) U.S. Cl.
CPC ... *H03D 7/1441* (2013.01); *H01L 21/823475* (2013.01); *H01L 23/66* (2013.01); *H01L 2223/6605* (2013.01); *H01L 2223/6688* (2013.01)

(58) Field of Classification Search
CPC .. H03D 7/1458; H03D 7/1466; H03D 7/1475; H03D 7/1483; H03D 7/1491
USPC .......... 327/355–361; 455/323, 326
See application file for complete search history.

(56) References Cited

U.S. PATENT DOCUMENTS

| | | |
|---|---|---|
| 5,086,512 A | 2/1992 | Bartz |
| 5,774,801 A | 6/1998 | Li et al. |
| 6,713,938 B2 | 3/2004 | Nguyen |
| 2008/0014873 A1 | 1/2008 | Krayer et al. |

OTHER PUBLICATIONS

Analog Devices, Inc., ADI 2006 RF Seminar materials, Chapter IV: RF Components Active and Passive Mixers, 2006, available at http://www.mouser.com/pdfdocs/src-tutorials/RF-Components.pdf (accessed Sep. 12, 2016).
Avago Technologies, "Using the AMMP-6530 in Upconverter Applications from 6 GHz through 28 GHz," AMMP-6530 Application Note 5276, Avago Technologies, Sep. 1, 2010, pp. 1-8.
Bös, Thomas A., et al., "A Balanced Resistive Mixer Avoiding an IF Balun," IEEE MTT-S Digest 2002, pp. 245-248.
Carter, Bruce, "It's not just 50 ohms: Some termination tips for differential and single-ended amplifiers," Designlines Test & Measurement, Jul. 24, 2002.
Ferry, et al., "Characterizing Non-Standard Impedance Channels with 50 Ohm Instruments," DesignCon 2009, pp. 1-25, 2009.
Analog Devices, Inc, HMC815BLC5 (Preliminary): GaAs MMIC I/Q Upconverter 21-27 Ghz, Hittite Microwave Products from Analog Devices, Aug. 2015, pp. 1-6, available at http://www.analog.com/media/en/technical-documentation/data-sheets/hmc815b.pdf (accessed Sep. 12, 2016).

(Continued)

*Primary Examiner* — Dinh T Le
(74) *Attorney, Agent, or Firm* — Knobbe, Martens, Olson & Bear, LLP

(57) ABSTRACT

A single-ended mixer having a mismatched, high termination impedance is disclosed. The termination impedance can be mismatched by at least one order of magnitude higher than the standard impedance of a given design environment, such as a 50 Ohm environment for a radio frequency (RF) circuit. The termination impedance can be provided in close physical proximity to the mixer core of the single-ended mixer to allow a suitable bandwidth of operation.

21 Claims, 17 Drawing Sheets

(56) References Cited

OTHER PUBLICATIONS

M/A-COM Technology Solutions Inc., MAUC-010506: Up Converter 17.68-23.62GHz, M/A-COM Technology Solutions, pp. 1-7, available at http://cdn.macom.com/datasheets/MAUC-010506.pdf (accessed Sep. 12, 2016).
Nash, Eamon, "Correcting Imperfections in IQ Modulators to Improve RF Signal Fidelity," Analog Devices AN-1039 Application Note, Analog Devices, Inc., 2009, pp. 1-8.
Newman, Eric J., "Designing with Single-Ended Passive Mixers for CDMA-Based Systems," Analog Devices, Inc., 7 pages, available at http://www.analog.com/media/en/technical-documentation/technical-articles/Designing_with_SE_mixers.pdf (accessed Sep. 12, 2016).
Zumbahlen, Ed., Basic Linear Design, Chapter 4: RF/IF Circuits, Analog Devices, Inc., 2007, pp. 4.1-4.72.
Rubiola, Enrico, "Tutorial on the double balance mixer," FEMTO-ST Institute, Feb. 2, 2008, pp. 1-52.
Shuch, H. Paul, "Interstage 50-ohm terminator for vhf converters," Ham Radio, Feb. 1977, pp. 26-27.
Triquint Semiconductor, TGC4405: 17-27 GHz Upconverter, Oct. 2006, pp. 1-11.
Van Vorst, Daryl, "CMOS Bulk-Driven Mixers with Passive Baluns," University of British Columbia, Jun. 2008.

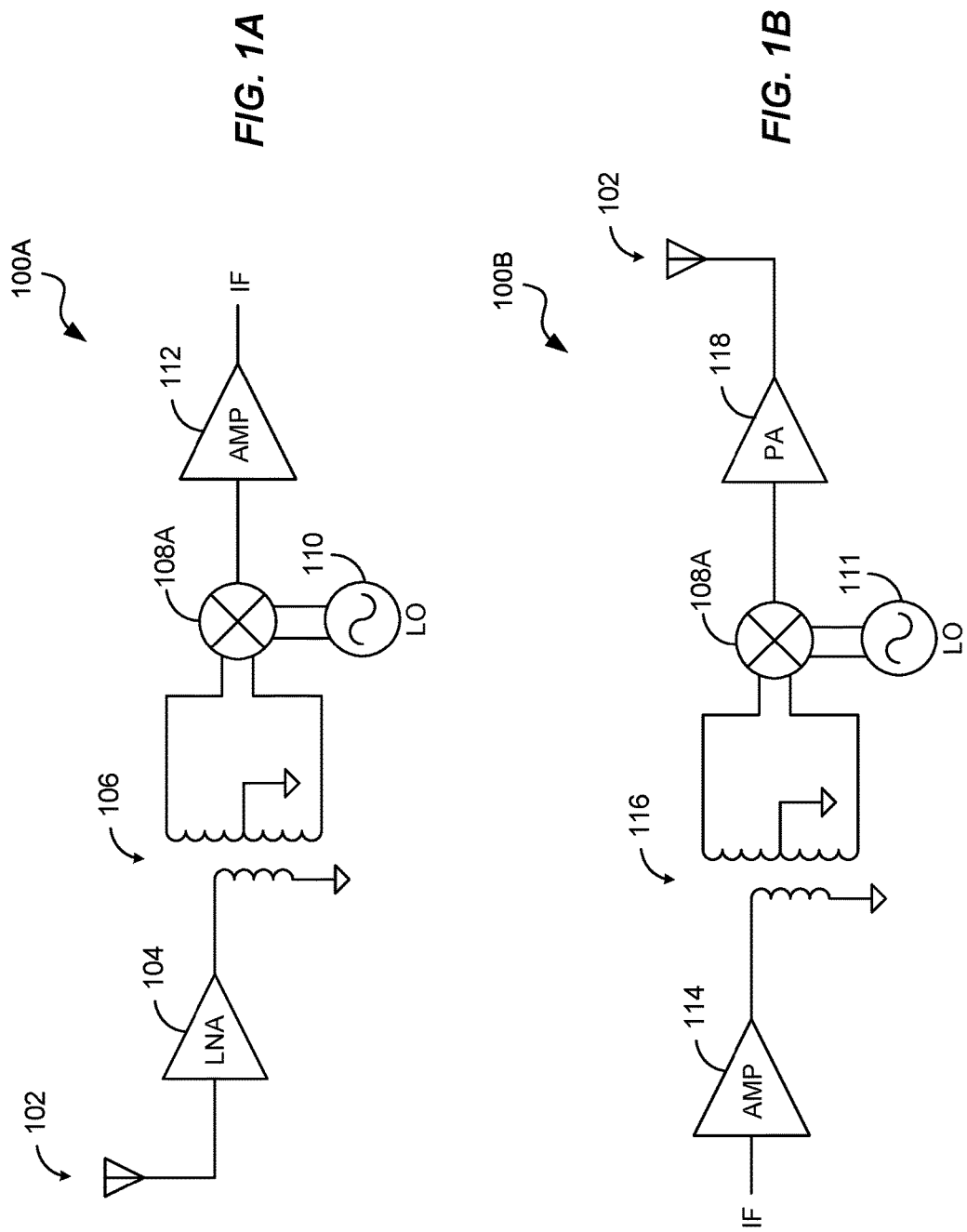

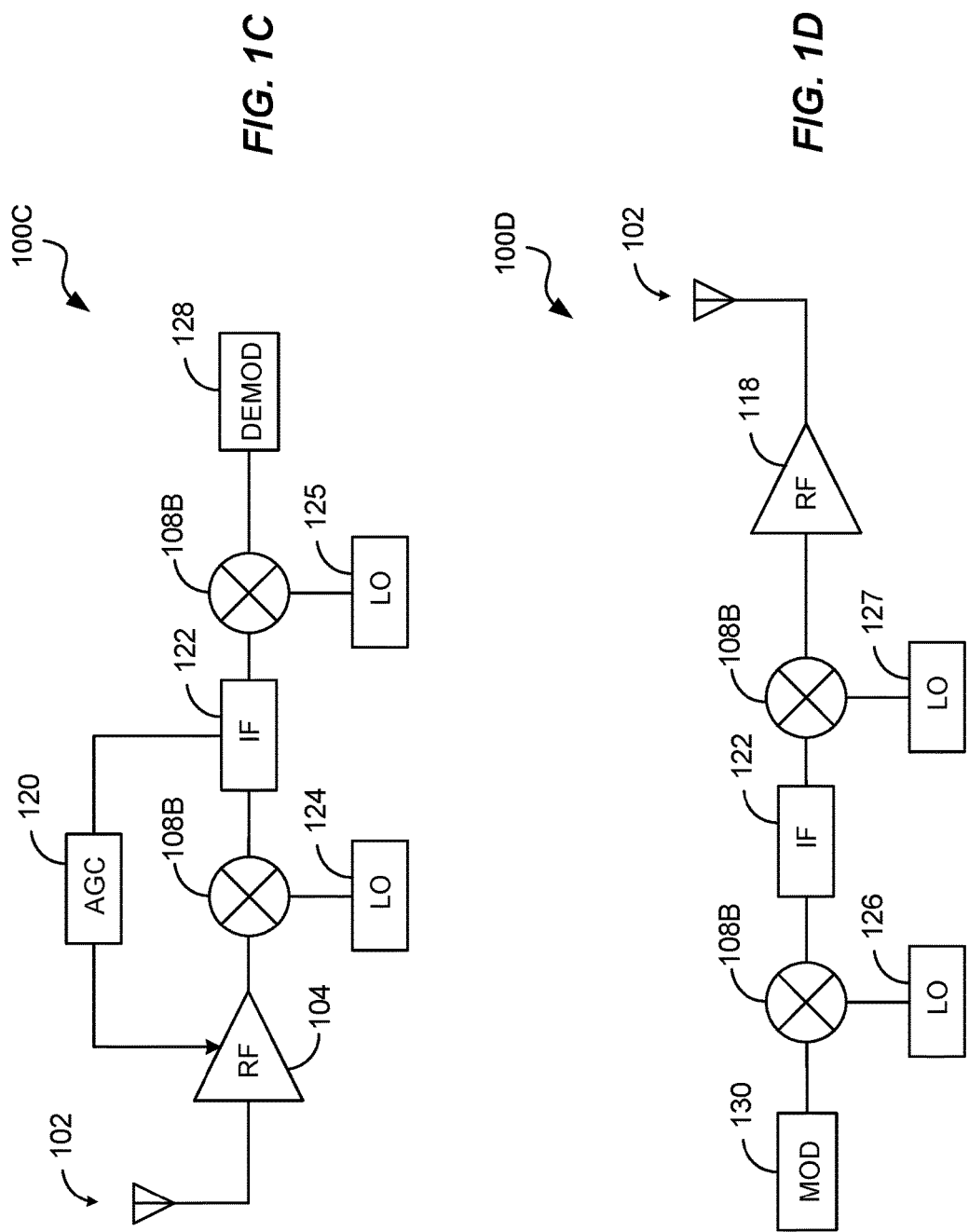

SINGLE-ENDED MIXER WITH REDUCED LOSS

BACKGROUND

Technical Field

The described technology generated relates to electronics and, more specifically, to mixers.

Description of the Related Art

Mixers are often used in various circuits such as radio frequency (RF) receivers and RF transmitters for functions, such as down converting or up converting. RF signals can be in a frequency range from about 30 kHz to 300 GHz. A single-ended mixer can be implemented using a differential mixer core and one or more baluns and/or one or more termination impedances. For RF circuits and microwave designs, it can be desirable to provide impedance matching and/or a termination impedance selected to match the standard transmission line impedance or nominal impedance of, for example, 50Ω. Other similar values, such as 30 Ω, 75Ω, or 77Ω, can be used in other similar designs depending on the characteristic impedance of the standard transmission medium. Matching the termination impedance can advantageously provide relatively high isolation in a passive mixer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one embodiment, an apparatus includes a mixer core configured to receive a differential input signal and a differential oscillator signal and to generate a differential signal across a first differential node and a second differential node, wherein the second differential node is configured to provide a single ended output of the mixer core. The apparatus also includes a mismatched termination impedance coupled to the first differential node of the mixer core, wherein the termination impedance is mismatched with a load impedance of the second differential node of the mixer core by at least one order of magnitude at a frequency of the single-ended output.

In another embodiment, a passive mixer includes a plurality of field effect transistors configured to mix a differential input signal with a differential oscillator signal to generate a differential signal between a first node and a second node, and a high termination impedance electrically coupled to the first node, wherein the second node is configured to provide a single-ended output of the passive mixer, and wherein the termination impedance is at least 0.5 kΩ at a frequency of the single-ended output.

In another embodiment, a method of manufacturing a mixer includes forming a plurality of field effect transistors adjacent to one another at an operational distance such that the plurality of field effect transistors are arranged as a mixer core and are configured to mix a differential input signal with a differential oscillator signal to generate a differential signal between a first node and a second node; forming a high termination impedance adjacent to one of the plurality of field effect transistors at a distance comparable to the operational distance of the plurality of field effect transistors; and electrically connecting the high termination impedance to of the first node, wherein the mixer is configured to provide a single-ended output at the second node, and wherein the high termination impedance is at least one order of magnitude higher than 50Ω at a radio frequency.

For purposes of summarizing the disclosure, certain aspects, advantages and novel features of the inventions have been described herein. It is to be understood that not necessarily all such advantages may be achieved in accordance with any particular embodiment. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments of the disclosure and are not intended to be limiting.

FIG. 1A is a diagram of an example implementation of the technology disclosed herein in a receiver circuit according to one embodiment.

FIG. 1B is a diagram of another example implementation of the technology disclosed herein in a transmitter circuit according to one embodiment.

FIG. 1C is a diagram of another example implementation of the technology disclosed herein in a receiver circuit according to one embodiment.

FIG. 1D is a diagram of another example implementation of the technology disclosed herein in a transmitter circuit according to one embodiment.

DETAILED DESCRIPTION OF CERTAIN EMBODIMENTS

Figure 2A:
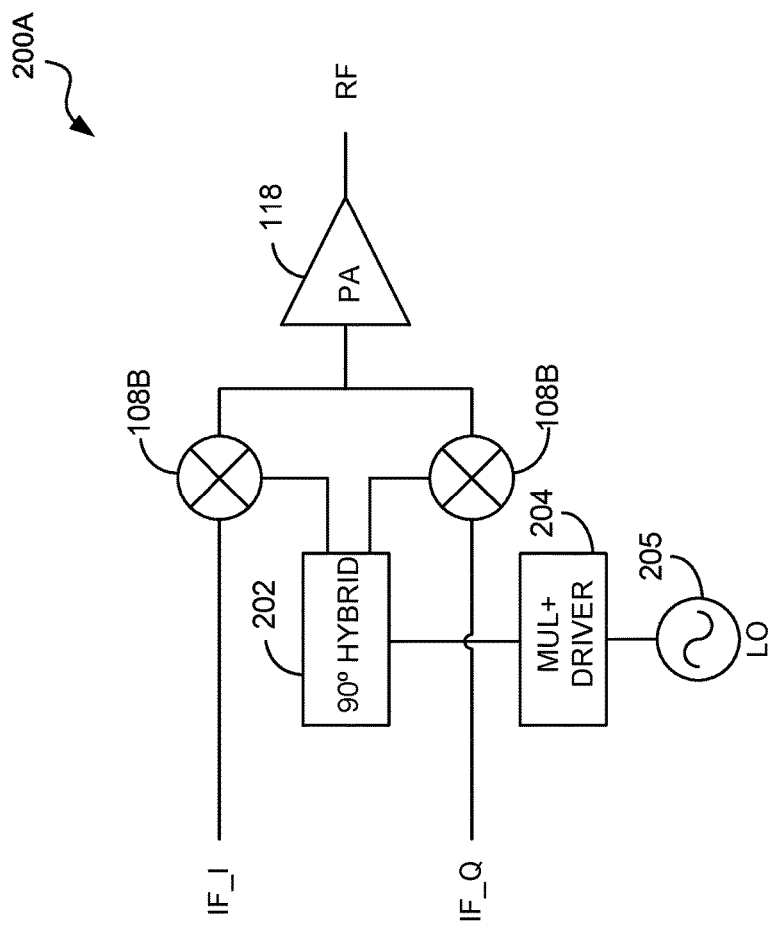
FIG. 2A is a diagram of an example implementation of the technology disclosed herein in a transmitter circuit according to another embodiment.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to any electronic system with a mixer (e.g., a mixer configured to bring an intermediate frequency signal to radio frequency or a mixer configured to bring a radio frequency signal to intermediate frequency), some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, it can be desirable to provide impedance matching and/or a termination impedance selected to match the standard transmission line impedance or nominal impedance of, for example, 50Ω. However, implementing a single-ended mixer by including a matched termination impedance, such as 50Ω, on one differential output of a mixer core can result in a loss of about 3 dB in gain in certain implementations. Such a loss in gain can be undesirable and significant. The single-ended mixers discussed herein can include a termination impedance on one differential output of a mixer core that can significantly reduce such a loss from the matched termination impedance. For instance, using the principles and advantages discussed herein, a single-ended mixer with a mismatched termination impedance at one differential node of a mixer core can cause a loss in gain of around 1 dB instead of about 3 dB for a matched termination impedance.

A single-ended mixer having a mismatched high termination impedance is disclosed. The single-ended mixer can be a passive mixer with a field effect transistor mixer core. The termination impedance can be mismatched by at least one order of magnitude higher than the standard impedance of a given design environment, such as a 50 Ohm environment for an intermediate frequency (IF) circuit and/or an RF circuit. The termination impedance can be provided in relatively close physical proximity to the core of the single-ended mixer to allow a suitable bandwidth of operation.

The single-ended mixers disclosed herein can achieve a number of advantages in certain embodiments. As one example, the single-ended mixers herein can be implemented using a differential mixer core and a high termination impedance such that conversion gain is not significantly reduced. For systems with IF down to direct current (DC) signals, baluns at the IF side may not be practical. In such systems, it can be difficult to generate a differential IF signal. Using the principles and advantages discussed herein, a quad field effect transistor mixer or the like can be implemented in a single-ended IF system without losing too much conversion gain. The balanced mixer topologies discussed herein can achieve relatively high port to port isolations. Embodiments with field effect transistor mixer cores can provide relatively high linearity. As described herein, a "single-ended" mixer can be understood as a mixer providing a single-ended output, and a "single-ended" mixer may receive single ended or differential input and/or local oscillator signals.

FIG. 1A to FIG. 2B illustrate example electronic systems that can include the mixers designed in accordance with the principles and advantages discussed herein.

FIG. 1A is a diagram of an example implementation of the technology disclosed herein in a receiver according to one embodiment. The illustrated receiver 100A includes an antenna 102, a low noise amplifier (LNA) 104, a receive signal balun 106, a mixer 108A, a local oscillator 110, and an amplifier 112. In certain embodiments, the LNA 104, the receive signal balun 106, the mixer 108A, and the amplifier 112 can be included on a single integrated circuit. The antenna 102 and the local oscillator 110 can be external or internal to the integrated circuit. It will be understood that the receivers and/or the transmitters illustrated in FIGS. 1A-2B may include fewer or more elements than illustrated. In certain implementations, the receivers and/or transmitters disclosed herein can include additional elements or components such as intermediate frequency (IF) bandpass filters for filtering out unwanted harmonics, for example. As another example, any of the illustrated antennas can be used for both transmitting RF signals and receiving RF signals and a switch can selectively electrically connect a transmit path or a receive path to such an antenna. As described herein, same or corresponding numerals and/or names of elements in FIGS. 1A-5 and their descriptions indicate the elements having similar or corresponding functionalities and/or characteristics.

The illustrated receiver 100A can receive an RF signal at the antenna 102, and the RF signal can be provided to the LNA 104. The LNA 104 can amplify the received RF signal and provides the amplified RF signal to the receive signal balun 106. The receive signal balun 106 provides a differential output signal to the mixer 108A. In some instances, the receive signal balun 106 can be implemented with a transformer. The local oscillator 110 can provide a differential local oscillator output signal to the mixer 108A. The amplifier 112 receives a mixer output from the mixer 108A, and the amplifier 112 may output an amplified IF signal for further processing.

The mixers 108A illustrated in FIGS. 1A-1B are single-ended, as the illustrated mixer 108A provides a single-ended output while receiving differential inputs. Further details of the mixer 108A are discussed in connection with FIGS.

3A-3B below. Also, as further illustrated in and discussed in connection with FIGS. 1C-2B and 4A-4B below, in some embodiments the mixers disclosed herein can be implemented as a fully singled-ended mixer (e.g., 108B) providing a single-ended output and receiving a single-ended input and a single-ended local oscillator signal. In some embodiments, the mixers disclosed herein can be implemented with a passive mixer, ring mixer, and/or double-balanced mixer, such as a Gilbert cell mixer or Gilbert cell quad multiplier block. In some embodiments, the mixers disclosed herein can implemented with field effect transistors (FETs), such as metal oxide semiconductor (MOS) transistors, which can be in complementary form, junction field effect transistors (JFETs), laterally diffused metal oxide semiconductor (LD-MOS) transistors, GaAs metal semiconductor field effect transistors (GaAs MESFETs), pseudomorphic high electron mobility transistors (pHEMTs), or the like. While the terms "metal" and "oxide" may be present in for example, MOS, such transistor scan have gates made out of materials other than metals, such as polysilicon, and have dielectric oxide regions made from dielectrics other than silicon oxide, such as a high-κ dielectric. According to some other embodiments, mixers implemented in accordance with the principles and advantages discussed herein can be with bipolar transistors, such as SiGe bipolar transistors or GaAs heterojunction bipolar transistors.

FIG. 1B is a diagram of another example implementation of the technology disclosed herein in a transmitter according to one embodiment. The illustrated transmitter 100B includes an amplifier 114, a transmit signal balun 116, a mixer 108A, a local oscillator 111, a power amplifier 118, and the antenna 102. In certain embodiments, the amplifier 114, the transmit signal balun 116, the mixer 108A, and the power amplifier 118 can be included on an integrated circuit, and the antenna 102. The local oscillator 111 can be external to or part of the integrated circuit.

The illustrated transmitter 100B includes the amplifier 114 that receives an IF signal and outputs an amplified IF signal to the transmit signal balun 116. The transmit signal balun 116 provides a differential output signal to the mixer 108A. In some instances, the transmit signal balun 116 can be implemented with a transformer. The local oscillator 110 can provide a differential local oscillator output signal to the mixer 108A. The power amplifier 118 receives a mixer output from the mixer 108A, and the power amplifier 118 provides an amplified RF signal to the antenna 102 to be transmitted.

The mixers 108A in the illustrated circuits 100A, 100B in FIGS. 1A-1B can be implemented as further illustrated in and described in connection with FIGS. 3A-3B and 5 below.

FIG. 1C is a diagram of another example implementation of the technology disclosed herein in a receiver according to one embodiment. The illustrated receiver 100C is a superheterodyne radio receiver. The illustrated receiver 100C includes the antenna 102 configured to receive an RF signal, which is then amplified by the LNA 104. The illustrated receiver 100C also includes the mixers 108B, local oscillators 124, 126, and an IF circuit 122, to generate a demodulated signal 128. The illustrated receiver 100C includes an automatic gain control (AGC) circuit 120 configured to adjust gain of the LNA 104 based at least in part on a signal from the IF circuit 122. The IF circuit 122 may include one or more filters and/or amplification circuits.

FIG. 1D is a diagram of another example implementation of the technology disclosed herein in a transmitter according to one embodiment. The illustrated transmitter 100D is a superheterodyne radio transmitter. The illustrated transmitter 100D includes the mixers 108B, the local oscillators 126, 124, and the IF circuit 122, to generate an RF signal from a modulated signal 130. The RF signal is amplified by the power amplifier 118 and transmitted with the antenna 102.

FIG. 2A is a diagram of an example implementation of the technology disclosed herein in a transmitter according to another embodiment. FIG. 2A shows an in-phase/quadrature-phase (I/Q) mixer in a transmitter implemented using the technology disclosed herein. The illustrated transmitter 200A is an example transmitter for processing in-phase (I) and quadrature-phase (Q) signals, which ideally have a phase separation of 90°. The illustrated transmitter 200A includes the mixers 108B each receiving an in-phase IF signal, IF_I, a quadrature-phase IF signal, IF_Q, and a local oscillator signal to generate a mixer output signal. A power amplifier 118 in the illustrated transmitter 200A receives the mixer output signals from the mixers 108B and generates an RF signal, RF, to be transmitted. The illustrated transmitter 200A includes a 90° hybrid coupler 202 for providing local oscillator signals ideally 90° apart to each other to each of the mixers 108B in the in-phase and quadrature-phase signal paths. The illustrated transmitter 200A further includes a multiplier and driver 204 configured to receive a local oscillator signal from a local oscillator 205. The driver of the multiplier and driver 204 can amplify the signal generated from the local oscillator 205 in order to provide adequate power for the I/Q mixer to operate. The multiplier of the multiplier and driver 204 can adjust frequency of the signal provided by the local oscillator 205 to a frequency used in the transmit chain and/or the receive chain. For instance, in some cases the frequency of the signal provided by the local oscillator 205 can be lower than the frequency of operation of the transmit chain or the receive chain. The multiplier can increase the frequency of the signal provided by the local oscillator 205 by a factor, such as 2, 4, etc. In some other embodiments, the illustrated transmitter 200A can be implemented with a differential LO for the local oscillator 205, and the 90° hybrid coupler 202 can be replaced with a balun to receive a differential signal.

Figure 2B:
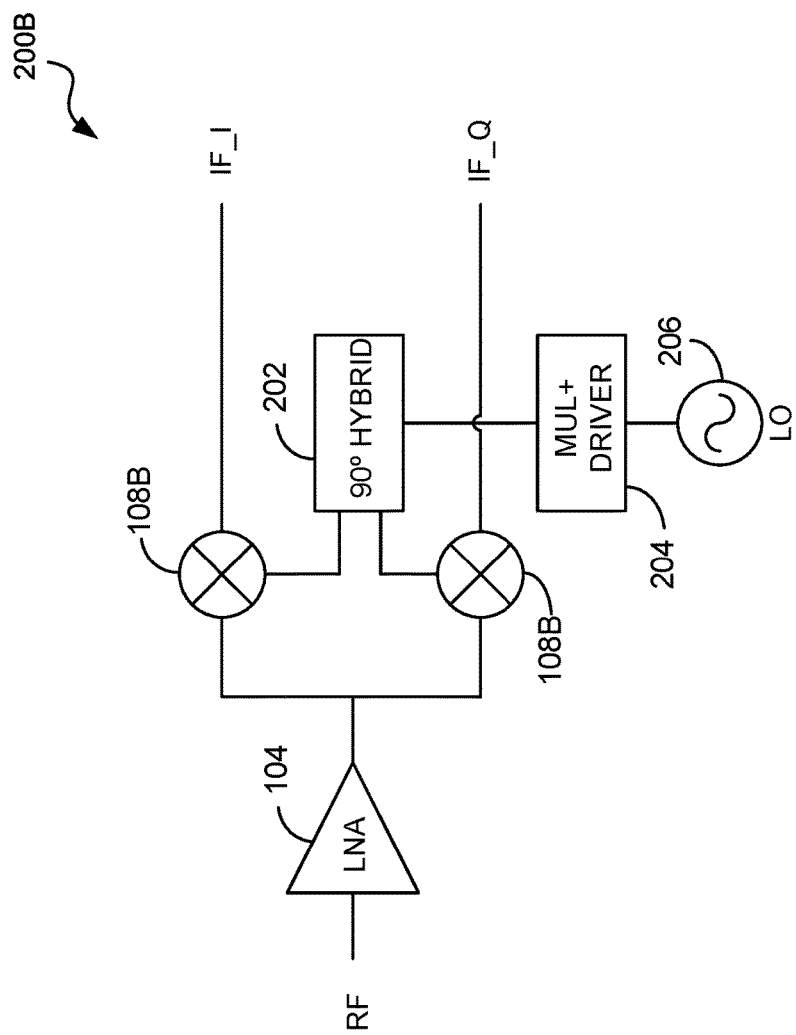
FIG. 2B is a diagram of another example implementation of the technology disclosed herein in a receiver circuit according to another embodiment.

FIG. 2B is a diagram of another example implementation of the technology disclosed herein in a receiver according to another embodiment. FIG. 2B shows an in-phase/quadrature-phase (I/Q) mixer in a receiver implemented using the technology disclosed herein. The illustrated receiver 200B is an example receiver for receiving an RF signal and generating in-phase and quadrature IF signals, which ideally have a phase separation of 90°, for further processing. The illustrated receiver 200B includes the LNA 104 that receives and amplifies the RF signal, and the mixers 108B each generating the in-phase IF signal, IF_I, a quadrature-phase IF signal, IF_Q, by mixing the output of the LNA 104 and respective local oscillator signals. The illustrated receiver 200B also includes the hybrid coupler 202 for providing local oscillator signals ideally 90° apart to each other to each of the mixers 108B in the in-phase and quadrature-phase IF signal paths. Similar to the transmitter 200A, the illustrated receiver 200B further includes the multiplier and driver 204 and the local oscillator 206. In some other embodiments, the illustrated receiver 200B can be implemented with a differential LO for the local oscillator 206, and the 90° hybrid coupler 202 can be replaced with a balun to receive a differential signal.

Similar to the mixers 108A in FIGS. 1A-1B illustrated and discussed above, the mixers 108B can be similarly implemented with passive mixers. The mixers 108B in the illustrated circuits 100C, 100D, 200A, 200B in FIGS. 1C-2B can be implemented as further illustrated in and described in connection with FIGS. 4A-4B and 5 below.

Figure 3A:
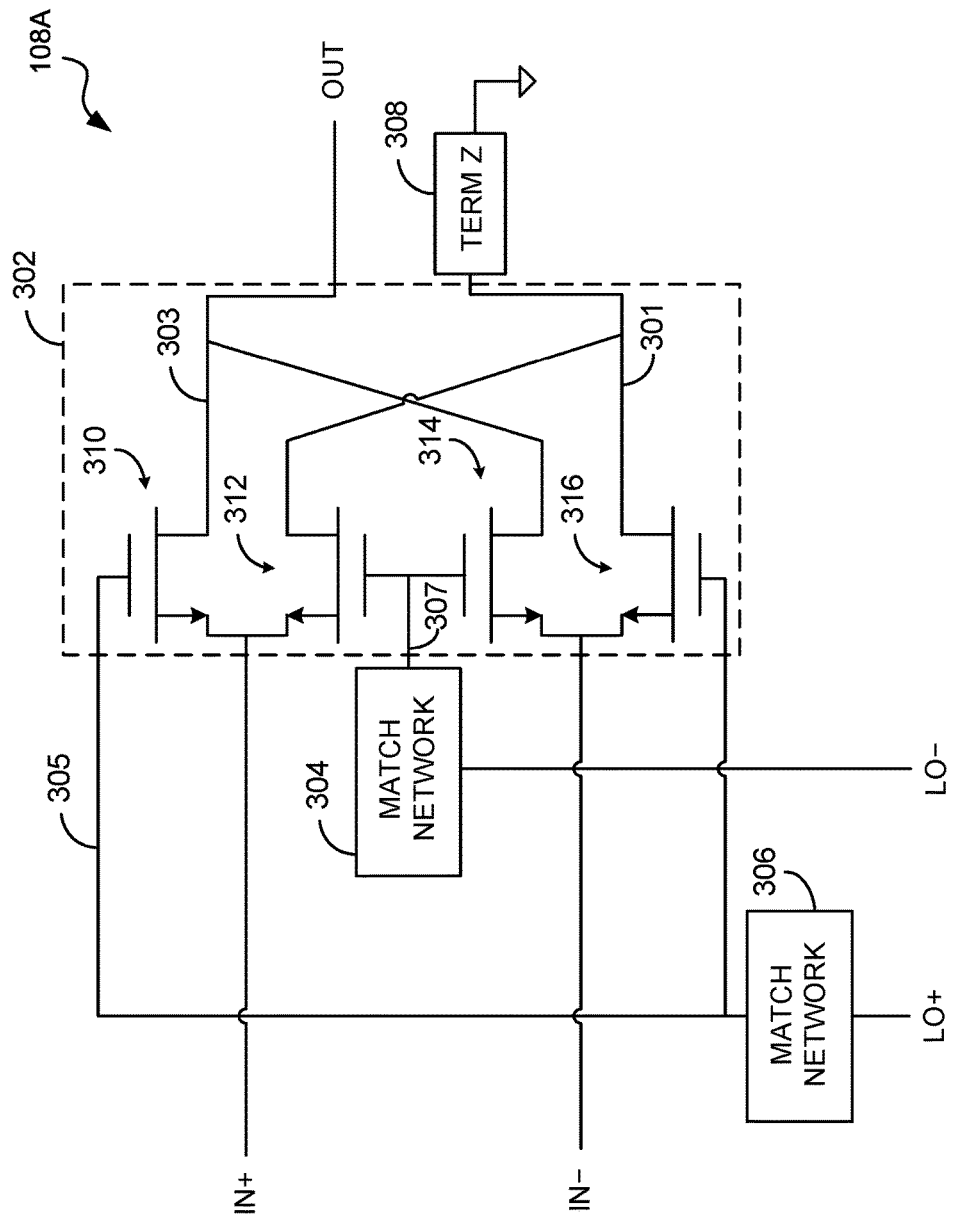
FIG. 3A is a diagram of a single-ended mixer according to one embodiment.

FIG. 3A is a diagram of a single-ended mixer according to one embodiment. The illustrated mixer 108A receives a differential input signal, IN+ and IN−, and a differential local oscillator signal, LO+ and LO−, and generates a single-ended output, OUT. The illustrated mixer 108A includes a mixer core 302, a matching network 304 coupled to a LO negative differential node 307 of the mixer core 302 and a matching network 306 coupled to a LO positive differential node 305 of the mixer core 302. The mixer core 302 includes a first differential node 301 and a second differential node 303. The first differential node 301 of the mixer core 302 is coupled to a termination impedance 308, and the second differential node 303 of the mixer core 302 provides the single-ended output, OUT. The illustrated mixer 108A in FIGS. 3A-3B can be implemented in a receive circuit and/or a transmit circuit for mixing functions, such as down converting or up converting. As such, the differential input signal, IN+ and IN−, may correspond to a differential RF signal in a receive circuit or a differential IF signal in a transmit circuit. Similarly, the single-ended output signal, OUT, may correspond to an IF signal in a receive circuit or a RF signal in a transmit circuit.

The mixer core 302 includes transistors 310, 312, 314, and 316 configured to mix the differential input and differential local oscillator signals to generate a differential mixer core output across the first differential node 301 and the second differential node 303. As illustrated in FIG. 3A, the mixer core 302 can be a passive quad FET mixer or a FET ring mixer, which can be implemented with NFET and/or PFET transistors. In a passive mixer, each transistor can operate as a switch that is either on or off. The transistors for a passive mixer can electrically connect two nodes when on and electrically isolate the two nodes when off. In a passive mixer, transistors can be periodically turned on and off to mix signals. A passive mixer can be in series with an active circuit and pass DC current of the active circuit. The differential LO signal, LO+ and LO−, received at the differential LO nodes 305, 307 by way of the matching networks 304, 306, can turn different transistors 310, 312, 314, and 316 of the mixer core 302 on and off. The mixer core 302 can alternatingly connect the differential input, IN+ and IN−, at the differential input nodes to the differential output nodes of the mixer core 302.

As illustrated in FIG. 3A, one of the differential output nodes 301, 303 of the mixer core 302 is terminated with the termination impedance 308 while the other differential output node of the mixer core 302 produces the single-ended output, OUT, of the mixer 108A. In this example, the differential node 301 is coupled to the termination impedance 308 while the differential node 303 provides the single-ended output, OUT, but the selection of a termination node and a mixer output node can vary in other embodiments. In some embodiments, the termination impedance 308 can be implemented with a resistor. In some other embodiments, the termination impedance 308 can be implemented with other passive circuit elements such as one or more capacitors and/or inductors implementing complex impedance. A combination of a resistor and one or more other passive impedance elements can implement the termination impedance 308 according to certain embodiments. The termination impedance 308 can be implemented to have a mismatched termination impedance that is at least one order of magnitude higher than the overall circuit's standard operational or design environment. For example, some or all of the elements of the circuits illustrated in FIGS. 1A-5 herein may be designed in a standard environment, such as a 50 Ohm environment for RF circuits. The termination impedance 308 can have an impedance that is sufficiently high at a frequency within a range of interest (e.g., one or more ranges of radio frequency) such that the mixer 108A has a reduction in gain of no more than about 1 dB resulting from the termination impedance 308. In embodiments implemented in a standard 50 Ohm environment, the termination impedance 308 disclosed herein can be, for example, in a range from about 500Ω to 5,000Ω at a radio frequency, instead of being about 50Ω that matches the standard impedance. In some of these embodiments, the impedance of the termination impedance can in a range from about 1 kΩ to 2 kΩ at a radio frequency. As one example, the termination impedance 308 can be implemented by a 2 kΩ termination resistor. In some embodiments, a resistor of a fixed mismatched impedance (e.g., 1 kΩ in an RF circuit) can be used to implement the termination impedance 308. In some other embodiments, additional circuit elements can be used to implement a complex impedance that is about at least one order of magnitude higher than the standard impedance (e.g., 50Ω in an RF circuit) at a frequency within a range of interest (e.g., one or more ranges of radio frequency).

As also illustrated in FIG. 3A, the negative and positive differential oscillator signal nodes 305, 307 of the mixer core 302 can be coupled to the matching networks 304 and 306, respectively. In some embodiments, the matching networks 304, 306 can be implemented to counter the effects of the mismatched termination at the singled-ended output implemented with the termination impedance 308 or otherwise further improve functionality of the mixer 108A. The matching networks 304, 306 can be implemented, for example, with passive circuit elements such as resistors, capacitors, inductors, or any suitable combination thereof. In some embodiments, the matching network 304 can be implemented to have different values and/or characteristics than the matching network 306. These matching networks can be mismatched to counterbalance and/or compensate for the mismatch on the outputs of the mixer core 302 resulting from the relatively high impedance termination impedance 308. The mismatch of the matching networks 304, 306 can be implemented to counterbalance the mismatch on output nodes of the mixer core 302 and provide sufficient leakage and isolation performance in the mixer.

In general, mismatching termination impedance can result in degradation in insolation due to compromised signal differentiality of the differential signals at the nodes 301, 303 of the mixer core 302, which can allow output leakage. In some embodiments, the matching networks 304, 306 can be implemented to reduce the degradation in isolation by countering the mismatch at the nodes 301, 303 of the mixer core 302 to restore signal differentiality and reduce leakage. In some embodiments, the matching networks 304, 306 can be implemented with various passive circuit components, such as one or more of resistors, capacitors, inductors, etc. An example implementation of the matching networks 304, 306 is discussed in connection with FIG. 4E below. In some embodiments, matching networks 304, 306 can be implemented at the local oscillator side (e.g., at nodes 305, 307) as shown in FIGS. 3A, 3B, 4A, 4B below. In some other embodiments, matching networks 309, 311 can be implemented at the input signal side (e.g., at nodes 317, 319) as shown in FIGS. 3C, 3D, 4C, 4D below. Moreover, matching networks can be implemented at both the local oscillator side and at the input signal side according to certain embodiments. Also, in some embodiments, one or more matching networks (e.g., 304, 306, 309, 311) can be implemented at one or more of the nodes of the local oscillator and/or input signal side of the mixer core 302. It is to be noted that various different matching topologies can be used to implement one or more of the matching networks 304, 306, 309, 311, and the topology of the matching networks and the values of the components of the matching networks can be selected based on circuit design principles according to the frequency of operation and an acceptable level of leakage.

A single-ended mixer implemented as disclosed herein can be advantageous in reducing loss in gain resulting from a standard or nominal impedance commonly used in circuit designs. For instance, using the standard 50Ω termination resistor for a single-ended RF mixer can result in a 3 dB loss in gain. By using a mismatched high impedance for termination of a single-ended mixer as disclosed herein, the 3 dB insertion loss can be reduced. For instance, a 24-27 GHz FET mixer implemented using the technology disclosed herein can achieve a low average conversion loss of about 8 dB rather than an average conversion loss of about 10 dB while achieving a high typical third-order input intercept point (IIP3) of about 25 dBm. Additionally, the mixers disclosed herein can be accompanied with LO nulling to improve the LO-RF isolation. For example, an LO nulling can be implemented by applying a relatively small DC offset typically in the order of about 10 mV to 30 mV at the mixer outputs. In certain instances, the DC offset can improve the LO-RF isolation reaching relatively high levels, up to 80 dB in certain implementations. The LO nulling technique can be employed when the frequency range of interest is relatively narrow and relatively high levels of isolation are desired in the relatively narrow frequency range. Further details of the improved performance of a single-ended mixer implemented as disclosed herein are illustrated and described in connection with FIGS. 6-8 below.

Figure 3B:
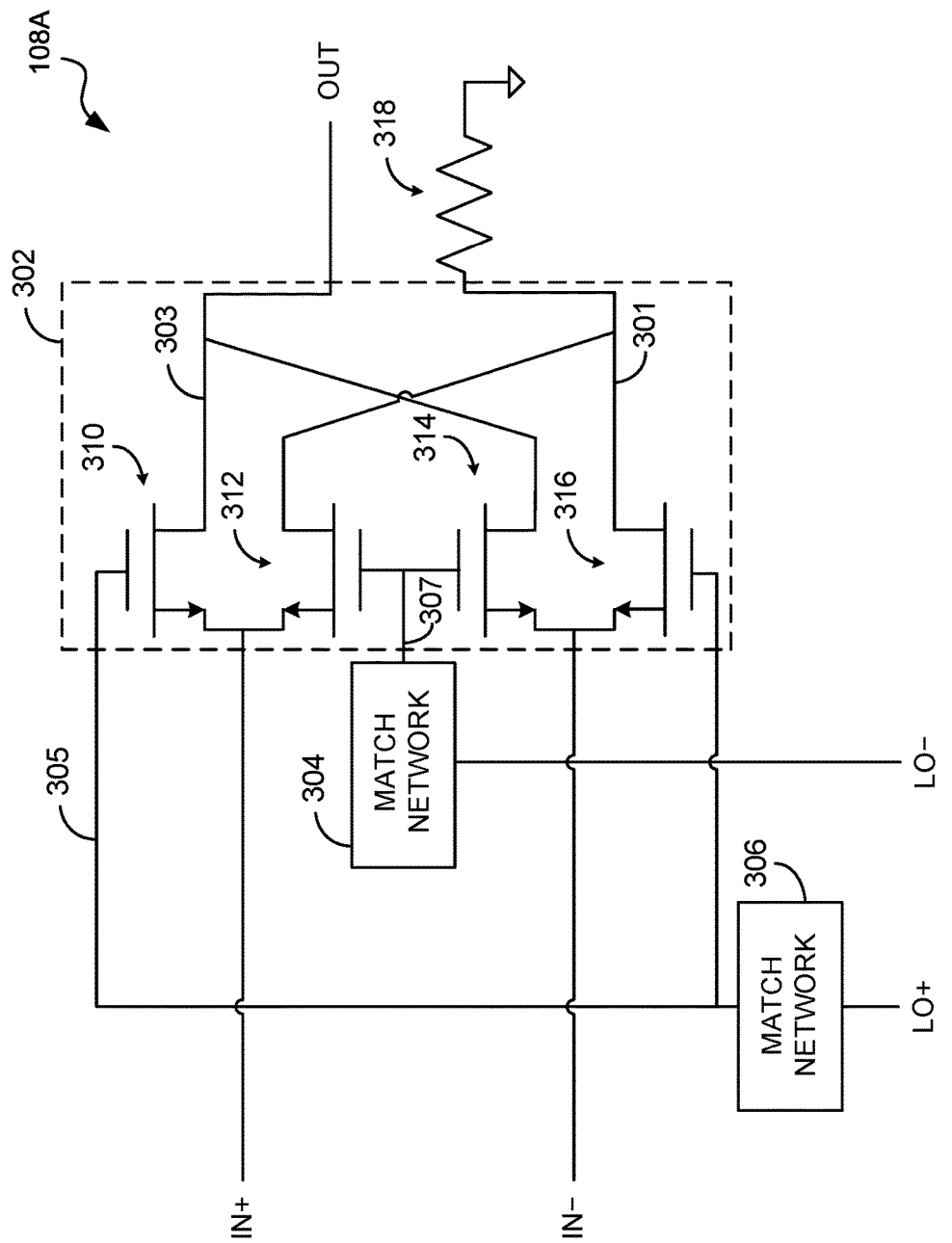
FIG. 3B is a diagram of a single-ended mixer according to another embodiment.

FIG. 3B is a diagram of a single-ended mixer according to another embodiment. The mixer 108A illustrated in FIG. 3B includes similar circuit elements corresponding to the elements of the mixer illustrated in FIG. 3A, except that the mixer illustrated in FIG. 3B includes a resistor 318 implementing the termination impedance 308 (FIG. 3A). The termination resistor 318 should have the same impedance for all frequencies. Accordingly, the mixer 108A of FIG. 3B can be used for mixing a variety signals having different frequencies without the termination impedance changing. The resistance of the resistor 318 can have any suitable characteristics of the termination impedance 308 discussed above. For instance, the resistance of the termination resistor 318 can be at least one order of magnitude higher than a standard termination resistance or matching impedance, such as 50Ω. The resistance of the termination resistor 318 can be in a range from about 500Ω to 5,000Ω. For instance, the disclosed technology can be implemented with the resistor 318 of about 2 kΩ in an RF circuit. In some embodiments, the resistance of the termination resistor 318 can be sufficiently high such that the mixer 108A has a reduction in gain of no more than a desired amount (e.g., about 1 dB) resulting from the impedance of the termination resistor 318. In certain instances, certain design considerations, such as parasitic effects, can be additionally considered in selecting a suitable resistance of the termination resistor 318.

Figure 3C:
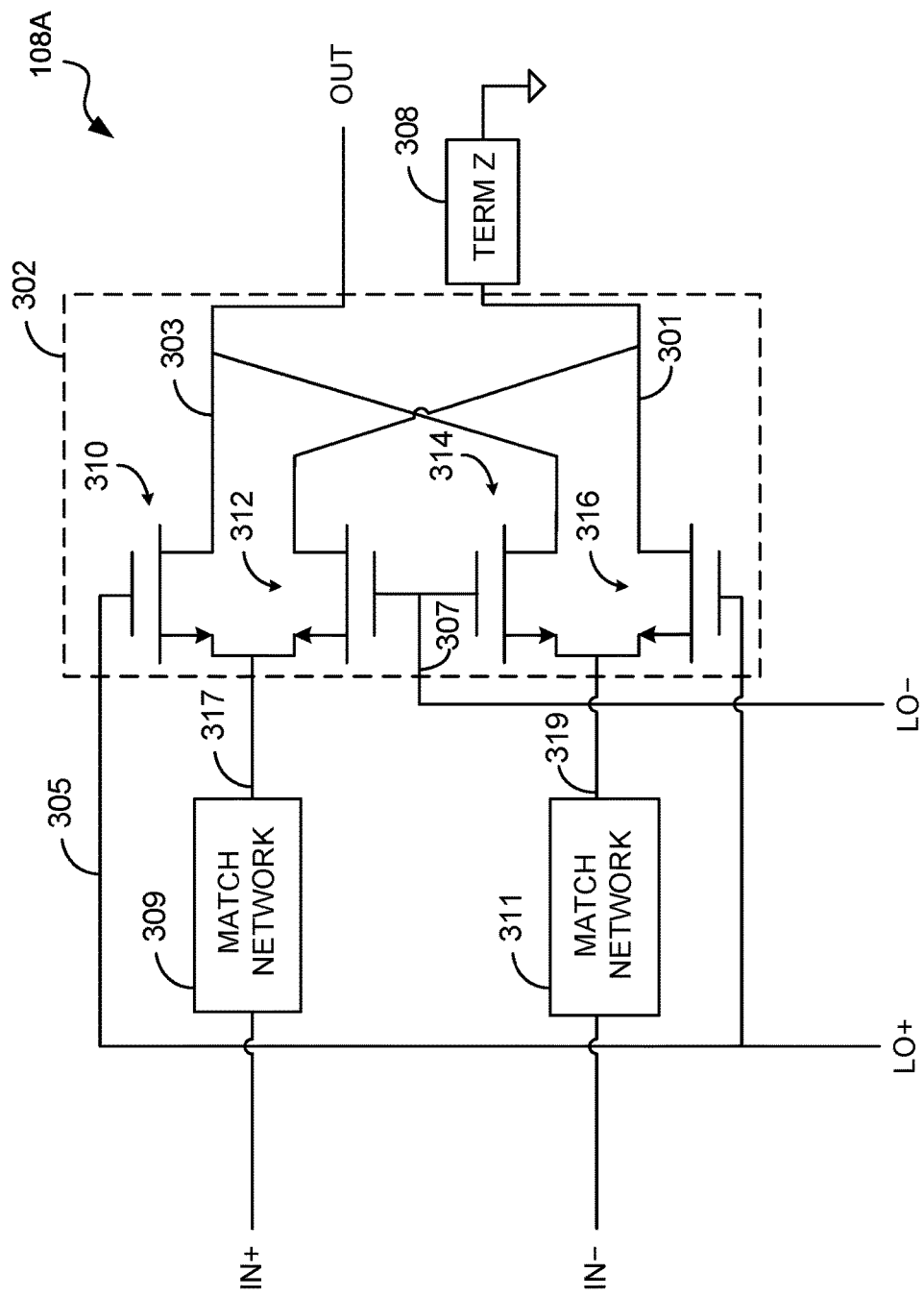
FIG. 3C is a diagram of a single-ended mixer according to another embodiment.

FIG. 3C is a diagram of a single-ended mixer according to another embodiment. The mixer 108A illustrated in FIG. 3C includes similar circuit elements corresponding to the elements of the mixer illustrated in FIG. 3A, except that the mixer illustrated in FIG. 3C includes a matching network 309 coupled to an IN positive differential node 317 of the mixer core 302 and a matching network 311 coupled to an IN negative differential node 319 of the mixer core 302. The matching networks 309, 311 can be implemented in accordance with any of the principles and advantages discussed with reference to FIG. 3A.

Figure 3D:
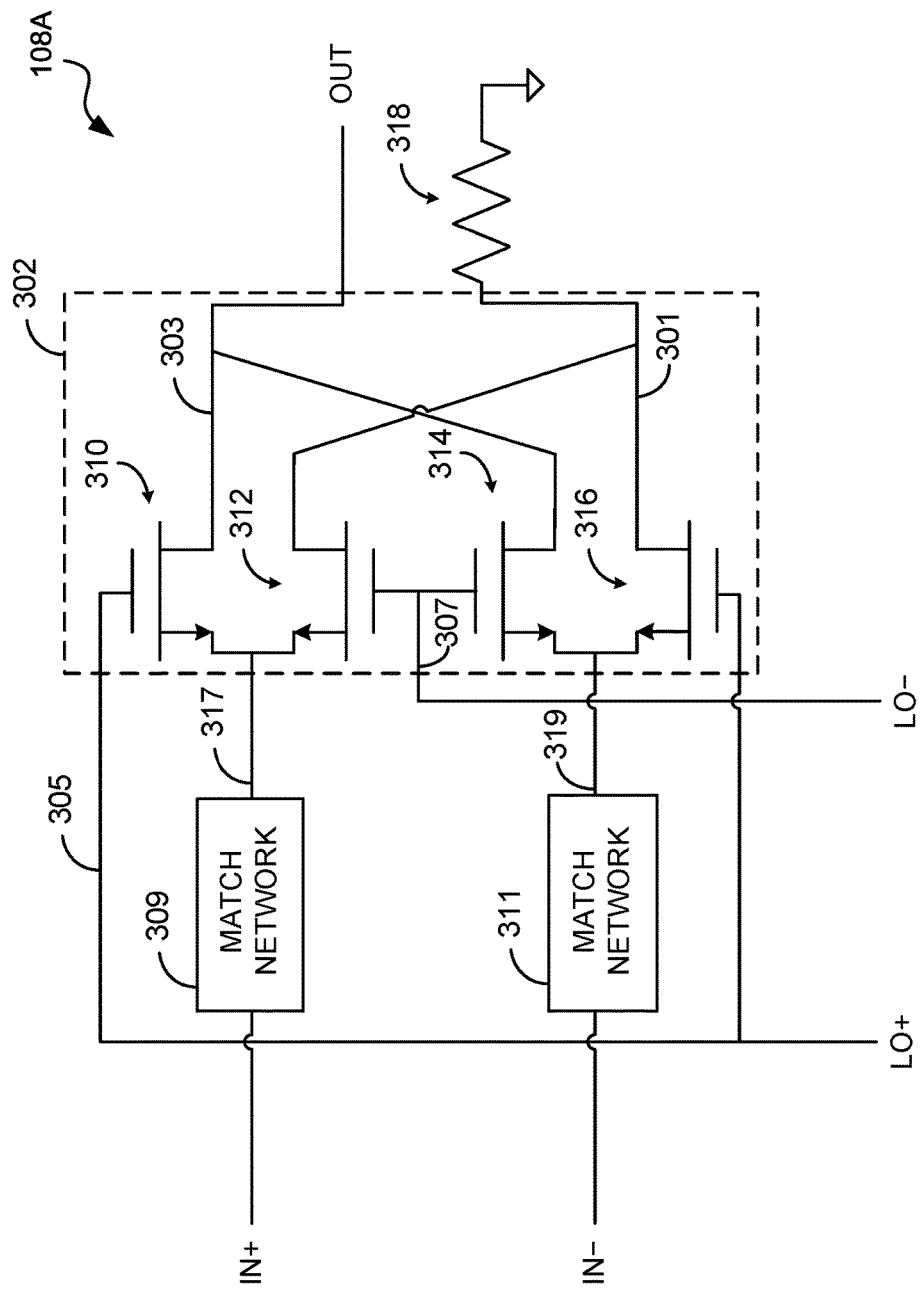
FIG. 3D is a diagram of a single-ended mixer according to another embodiment.

FIG. 3D is a diagram of a single-ended mixer according to another embodiment. The mixer 108A illustrated in FIG. 3D includes similar circuit elements corresponding to the elements of the mixer illustrated in FIG. 3C, except that the mixer illustrated in FIG. 3B includes a resistor 318 implementing the termination impedance 308 (FIG. 3C). The resistor 318 can be implemented in accordance with any of the principles and advantages discussed with reference to FIG. 3B.

Figure 4A:
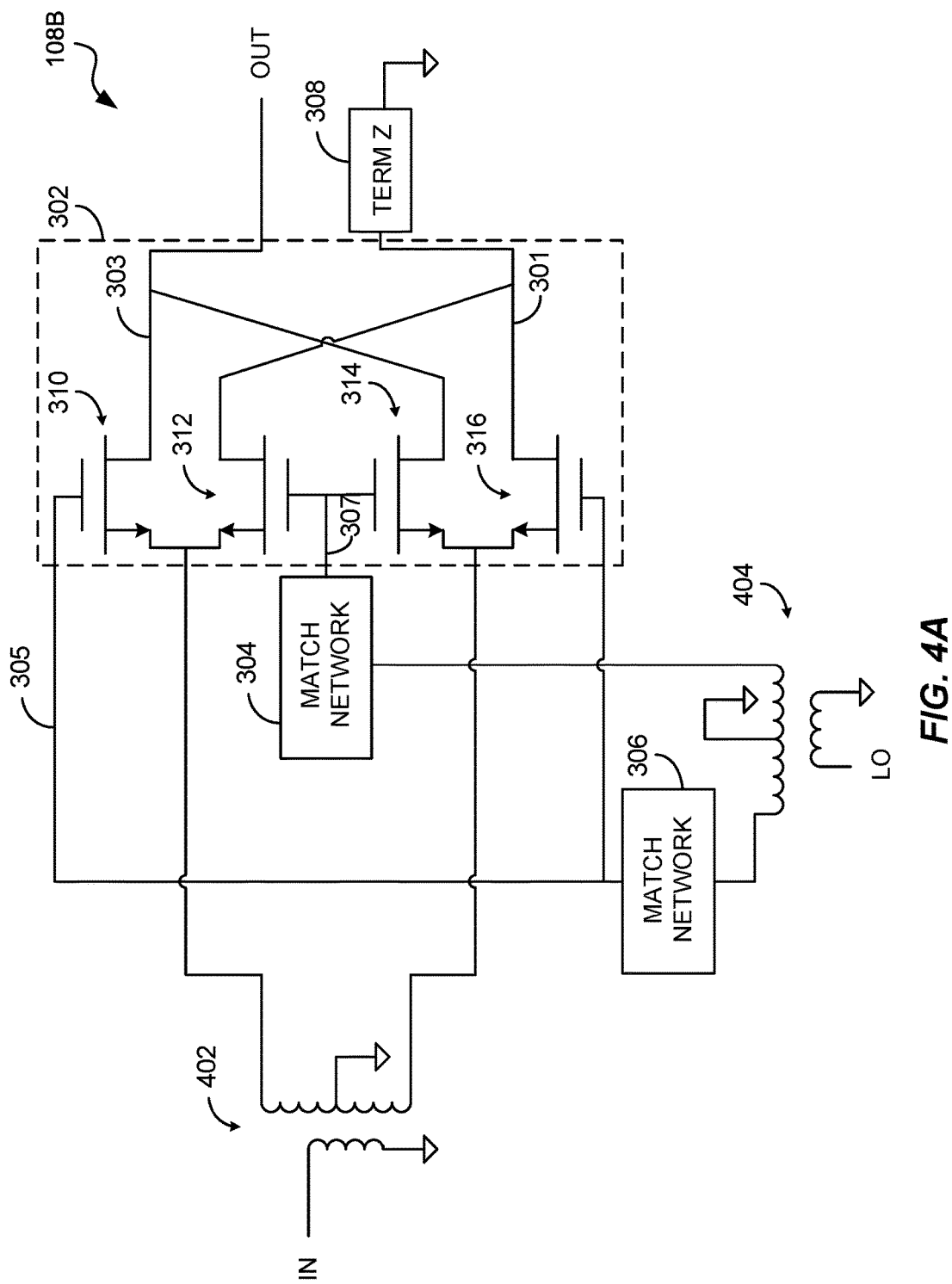
FIG. 4A is a diagram of a single-ended mixer according to another embodiment.

FIG. 4A is a diagram of a single-ended mixer according to another embodiment. The illustrated mixer 108B is a double-balanced FET ring mixer or a double-balanced quad FET mixer. The illustrated mixer 108B receives an input signal, IN, and a local oscillator signal, LO, and generates a single-ended output, OUT. The input signal, IN and the local oscillator signal, LO, are both single-ended signals in the mixer 108B. The illustrated mixer 108B includes an input balun 402, a local oscillator balun 404, the mixer core 302, the matching networks 304, 306, and a termination impedance 308. The input balun 402 can receive the single-ended input signal, IN, and provide a differential input signal to the mixer core 302. Similarly, the local oscillator balun 404 can receive the single-ended local oscillator signal, LO, and provide a differential local oscillator signal to the mixer core 302. In some embodiments, either or both of the baluns 402, 404 can be mismatched to counterbalance the mismatch at the output nodes 301, 303 of the mixer core 302 in addition to or instead of one or more of the matching networks 304, 306, 309, 311. For example, mismatching of either or both of the baluns 402, 404 can be implemented by changing the number of turns of balun differential outputs.

The illustrated mixer 108B in FIG. 4A can be implemented in a receive circuit and/or a transmit circuit for mixing functions, such as down converting or up converting. As such, the input signal, IN, may correspond to a RF signal in a receive circuit or an IF signal in a transmit circuit. Similarly, the single-ended output signal may correspond to an IF signal in a receive circuit or a RF signal in a transmit circuit. Similar to the mixer 108A of FIG. 3A, one of the differential outputs of the mixer core 302 is terminated with the termination impedance 308 while the other differential output of the mixer core 302 produces the single-ended output, OUT, of the mixer 108B. As such, the mixer illustrated in FIG. 4A includes similar elements corresponding to the elements of the mixer illustrated in FIG. 3A and has similar characteristics and can achieve similar advantages.

Figure 4B:
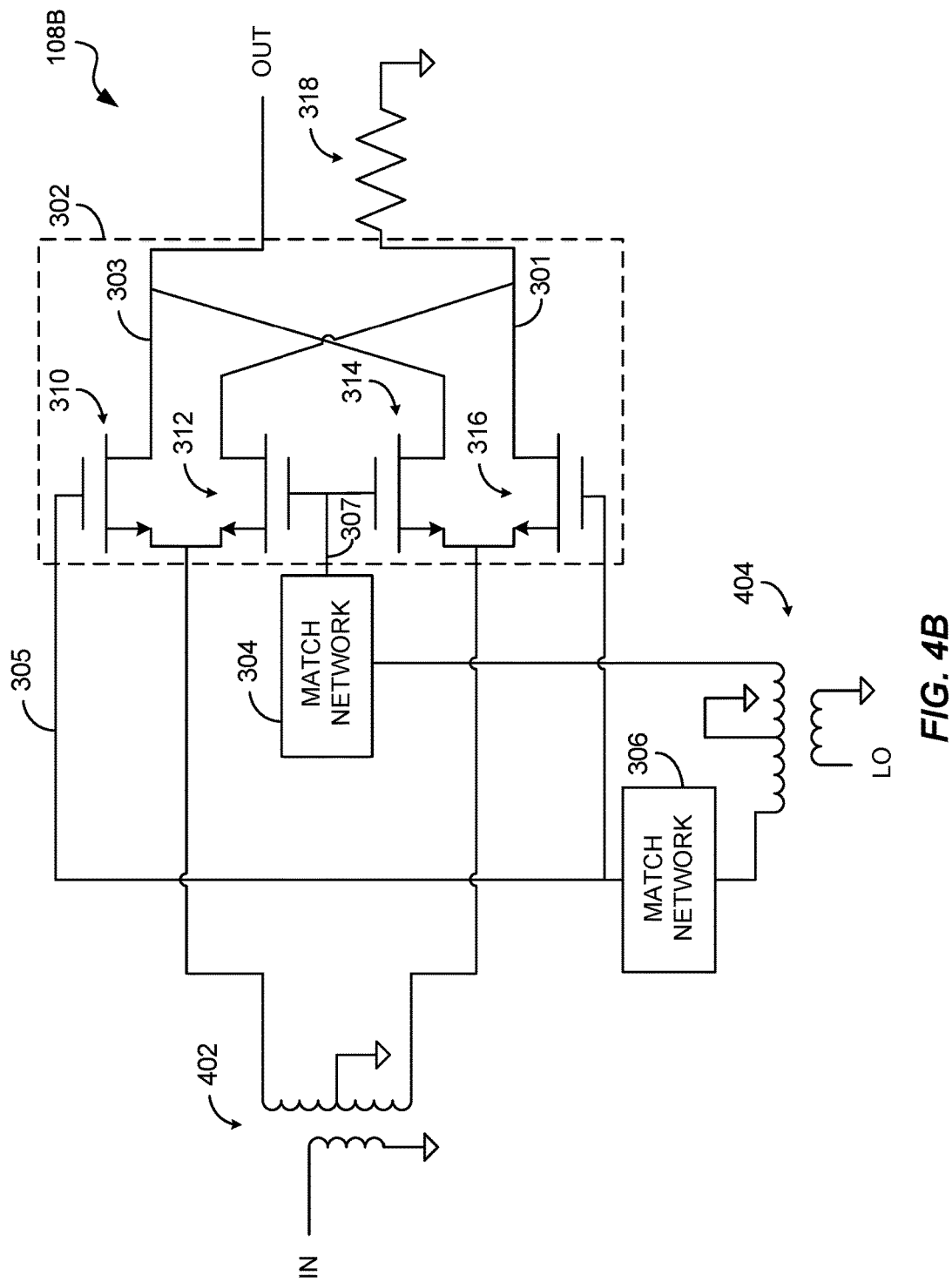
FIG. 4B is a diagram of a single-ended mixer according to another embodiment.

FIG. 4B is a diagram of a single-ended mixer according to another embodiment. The mixer 108B illustrated in FIG. 4B includes similar circuit elements corresponding to the elements of the mixer illustrated in FIG. 4A, except that the mixer illustrated in FIG. 4B includes the resistor 318 implementing the termination impedance 308 (FIG. 4A). The resistor 318 can be implemented in accordance with any of the principles and advantages discussed with reference to FIG. 3B. For instance, the resistance of the resistor 318 can have any of the resistance values discussed with reference to FIG. 3B.

Figure 4C:
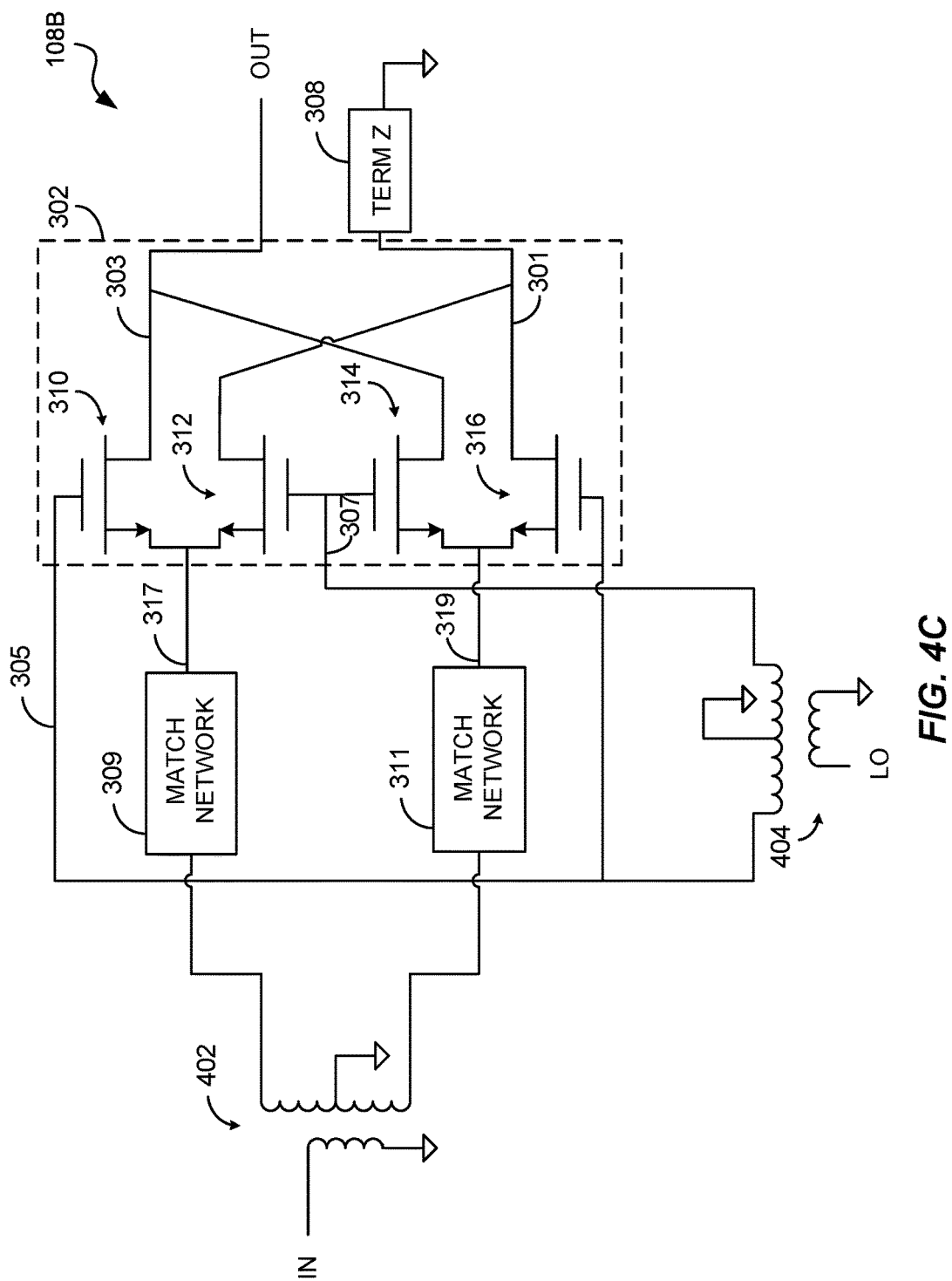
FIG. 4C is a diagram of a single-ended mixer according to another embodiment.

FIG. 4C is a diagram of a single-ended mixer according to another embodiment. The mixer 108B illustrated in FIG. 4C includes similar circuit elements corresponding to the elements of the mixer illustrated in FIG. 4A, except that the mixer illustrated in FIG. 4C includes the matching networks 309, 311 coupled to the differential nodes 317, 319 of the mixer core 302, respectively. The matching networks 309, 311 can be implemented in accordance with any of the principles and advantages discussed with reference to FIG. 3C.

Figure 4D:
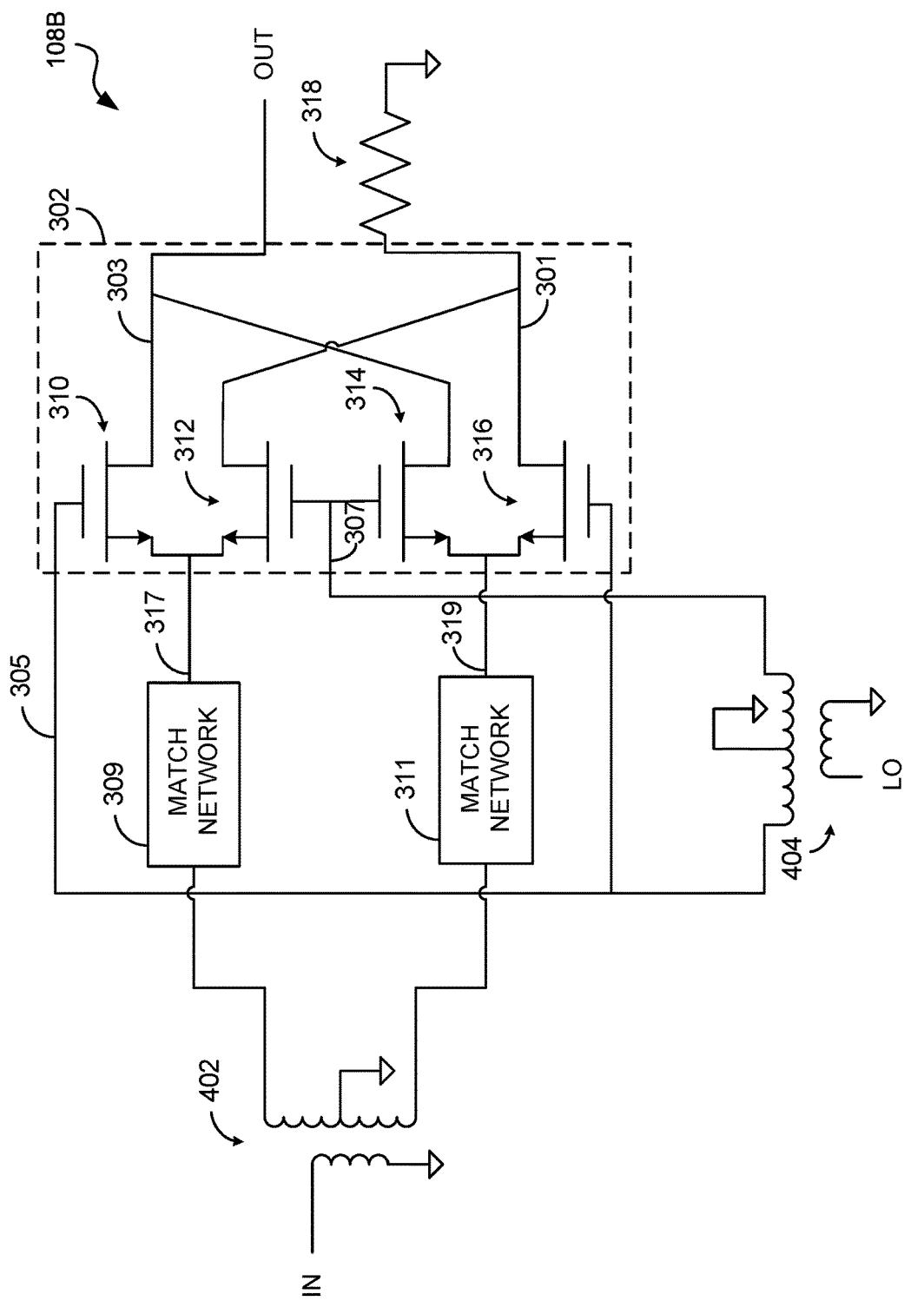
FIG. 4D is a diagram of a single-ended mixer according to another embodiment.

FIG. 4D is a diagram of a single-ended mixer according to another embodiment. The mixer 108B illustrated in FIG. 4D includes similar circuit elements corresponding to the elements of the mixer illustrated in FIG. 4C, except that the mixer illustrated in FIG. 4D includes the resistor 318 implementing the termination impedance 308 (FIG. 4C). The resistor 318 can be implemented in accordance with any of the principles and advantages discussed with reference to FIG. 3B.

Figure 4E:
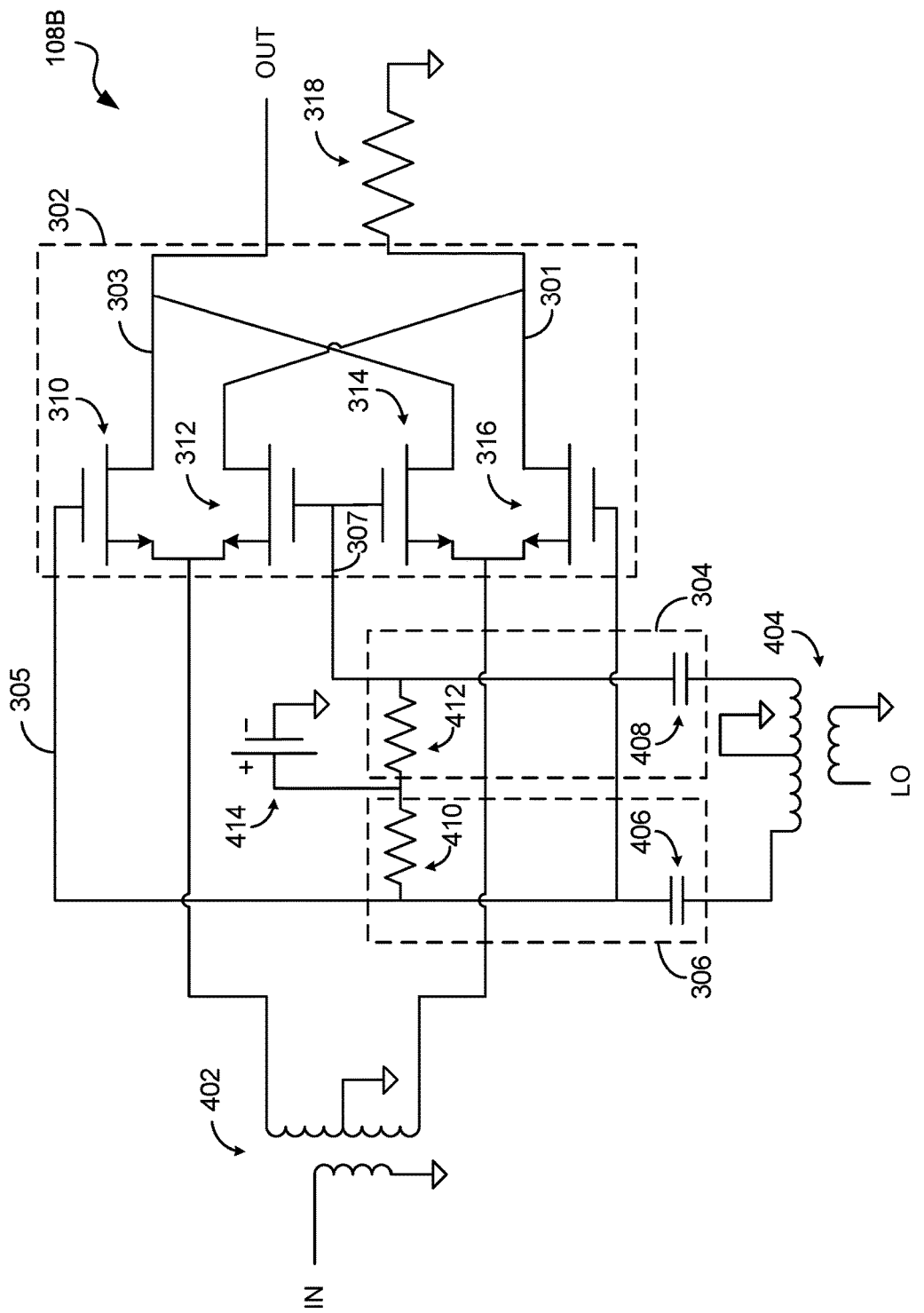
FIG. 4E is a diagram of a single-ended mixer according to another embodiment.

FIG. 4E is a diagram of a single-ended mixer according to another embodiment. The mixer 108B illustrated in FIG. 4E includes similar circuit elements corresponding to the elements of the mixer illustrated in FIG. 4B, except that the mixer illustrated in FIG. 4E provides illustrative matching networks 304 and 306. As illustrated, a resistor 410 and a capacitor 406 implement the matching network 306 and a resistor 412 and a capacitor 408 implement the matching network 304. In FIG. 4C, a DC bias source 414 provides a DC bias voltage to the matching networks 304 and 306. The resistors 410, 412 and the capacitors 406, 408 can be implemented in accordance with any of the principles and advantages of the matching networks 304, 306 discussed with reference to FIG. 3A. For instance, the resistance of the resistor 410 can be in a range from about 0.5 kΩ to 5 kΩ, such as about 1 kΩ As another example, the capacitance of the capacitor 406 can be in a range from about 0.5 pF to about 5 pF, such as about 2 pF. Also, the resistance of the resistor 412 can be have a similar resistance to the resistor 410, and the capacitance of the capacitor 408 can be similar to the capacitor 406. The resistance of the resistors 410 and 412 and the capacitance of the capacitors 406, 408 can be selected based on various considerations. The resistance of the resistors 410 and 412 can be selected according to considerations, such as coupling of the LO signal and the bias line connected to the DC bias source 414 and the impedance seen from the gates of the transistors 310, 312, 314, 316. For example, a resistance of 1 kΩ or higher can be beneficial for reducing couple of the LO signal and the bias line, if any, and making the impedance seen from the gates to be relatively small. Also, in certain embodiments, the capacitors 406, 408 can be part of the matching network 306, 304 that can be multi-section matching, which is suitable for wideband applications. The capacitance of the capacitors 406, 408 can be selected based on the mixer operating frequency range. In some embodiments, the resistance and/or capacitance of the matching networks 304, 306 can be of different values, respectively, for improved LO isolation. In some embodiments, the DC biasing can be implemented with an external pin that is provided to the mixer chip and connected to the DC bias source 414. In some embodiments, the DC bias level can be the pinch-off voltage of the transistors of the mixer 108, such as FETs.

In certain embodiments, any suitable principles and advantages described herein can be implemented in mixers with one of the input signal IN and the local oscillator signal LO as a differential signal while the other is single-ended signal. According to such embodiments, one of the baluns 402, 404 can be omitted. Also, in certain embodiments, all or any combination of the matching networks 304, 306, 309, and 311 can be used to implement different matching topologies to counter the mismatched termination impedance as appropriate.

Figure 5:
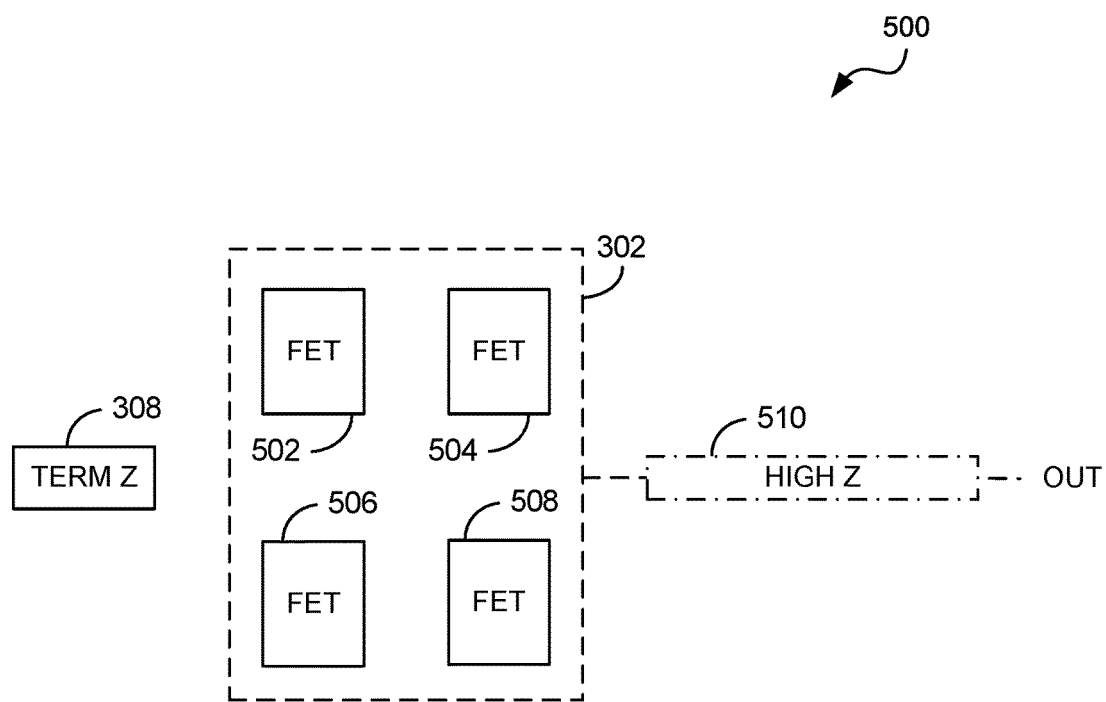
FIG. 5 is a diagram of a layout of circuit elements according to one embodiment.

FIG. 5 is a diagram of an example layout of circuit elements according to one embodiment. The illustrated layout 500 of FIG. 5 includes the termination impedance 308, the mixer core 302 having field effect transistors 502, 504, 506, and 508, and a high impedance connection 510. It is to be noted that layouts of electric connections between the illustrated circuit elements (e.g., the termination impedance 308, the FETs 502, 504, 506, and 508) are omitted in FIG. 5. Although not expressly illustrated in FIG. 5, the termination impedance 308 is coupled to one of the differential output nodes of the mixer core 302 as discussed above, and the high impedance connection 510 is coupled to the other of the differential output nodes of the mixer core 302 to produce the single-ended output, OUT, of the mixers 108A, 108B in FIGS. 3A-4B. As discussed above, the termination impedance 308 can be implemented with a resistor having a mismatched high magnitude resistance in the range from about 500Ω to 5,000Ω in an RF circuit, for example.

The sizes of the individual elements (e.g., 308, 502, 504, 506, and 508) of the layout 500 are not necessarily to scale and the solid lines do not necessarily illustrate the actual shapes, dimensions, or aspect ratios of these elements. The elements 308, 502, 504, 506, and 508 of the physical layout 500 are depicted to illustrate the relative distances between one another according to one embodiment. For example, the disclosed herein can be implemented with a distance between the FET 502 and the FET 504 being in the range of about 30 μm to 100 μm and a distance between the terminal impedance 308 and the FET 502 or between the termination impedance 308 and the FET 504 being in the range of also about 30 μm to 100 μm. As such, the distance between the terminal impedance 308 and one of the FETs 502, 504, 506, and 508 that is the closest to the terminal impedance 308 can be considered comparable to the distance between two of the FETs 502, 504, 506, and 508 that are adjacent to each other. As used herein the "comparable" distance can be understood as the distance that is a distance of the same or similar magnitude as the distance to which it is comparable. As illustrated in FIG. 5, the FETs 502, 504, 506, and 508 can be formed adjacent to one another at an operational distance, and the FETs 502, 504, 506, and 508 are arranged as the mixer core 302. Also as illustrated in FIG. 5, the high termination impedance 308 can be formed adjacent to one of the FETs 502, 504, 506, and 508 at a distance comparable to the operational distance of the FETs 502, 504, 506, and 508 within the mixer core 302.

As described herein the "distance" between the elements (308, 502, 504, 506, and 508) of the layout 500 can be understood as the shortest straight line distance between a point on the outermost outline of one element and a point on the outermost outline of another element. In some embodiments, the FETs 502, 504, 506, and 508 of the mixer core 302 can be physically located as closest as possible, or be near or at minimum operational distance to one another to reduce size. Similarly, the termination impedance 308 can be designed to be as closest to one or more FETs (502, 504, 506, and 508) of the mixer core 302 as possible, or be at or near minimum operational distance to the one or more FETs 502, 504, 506, and 508. In certain instances, the termination impedance 308 may not be at or near minimum operational distance from any one of the FETs 502, 504, 506, and 508 but at or near minimum operational distance from the FETs 502, 504, 506, and 508 collectively, e.g., the mixer core 302.

As described herein the "operational" distance can be understood as the distance allowing the intended individual functionalities of the elements (308, 502, 504, 506, and 508)

without significant interference or degradation in performance resulting from a close physical proximity of the elements (308, 502, 504, 506, and 508). Such an operational distance can be defined by layout rules for a particular process technology. Also, it will be understood that the one or more distances between the termination impedance 308, the FETs 502, 504, 506, and 508, and the mixer core 302 can further be adjusted according to the trade-offs between performance, size, and design restrictions (e.g., right-angled or 45° connections rather than straight Euclidian line connections). Thus, when reducing or minimizing distances between the elements (308, 502, 504, 506, and 508), reduction in distance along the line(s) of connection between the elements (308, 502, 504, 506, and 508) can be considered.

Implementing a single-ended mixer as disclosed herein with suitable distances between the elements can be advantageous in allowing a broader bandwidth of operation. For instance, having the termination impedance 308 as close as possible and/or with the shortest connection to the mixer core 302 (e.g., to one or more of the FETs 502, 504, 506, and 508) can increase bandwidth of the single-ended mixer. As such, the physical layout and/or the physical arrangement of the elements (e.g., 308, 502, 504, 506, and 508) can be selected to allow acceptable bandwidth for the mixer operation with the benefit of a reduced loss in gain discussed above in connection with FIG. 3A. As a single-ended mixer, the mixers 108A, 108B can provide a broad range of connections.

It is to be noted that the illustrated arrangement of the elements (308, 502, 504, 506, and 508) in FIG. 5, e.g., the termination impedance 308 being on the left side of the mixer core 302 and being vertically about half way over the vertical dimension of the mixer core 302 and the FETs 502, 504, 506, and 508 being in a 2 by 2 arrangement forming the mixer core 302, show only one example arrangement of the elements (308, 502, 504, 506, and 508). In other embodiments, the FETs 502, 504, 506, and 508 and the termination impedance 308 can be arranged differently with the termination impedance 308 and one or more of the FETs 502, 504, 506, and 508 being at comparable and/or approximately minimum operational distances from one another.

FIG. 5 also includes the high impedance connection 510 depicted in dotted lines. The high impedance connection 510 does not necessarily illustrate an actual layout of a high impedance line and is included to represent the connection from one of the differential output nodes of the mixer core 302 to the single-ended output node of the mixers 108A (FIGS. 3A-3B), 108B (FIGS. 4A-4B), which can include a pad that can be coupled to a circuit element external to the mixer. The high impedance connection 510, for example, can be implemented with a conductive line with a selection of different materials and/or lengths to achieve the desired impedance. The high impedance connection 510 can be implemented in connection with a single-ended output of any of the mixers discussed herein.

The illustrated termination impedance 308 and the FETs 502, 504, 506, and 508 of the mixer core 302 can be on one die. In some embodiments, one or more elements illustrated in FIGS. 1A-4B can be implemented on a single die. In some embodiments, the LO (e.g., 110 in FIGS. 1A-2B) can be in the same package as one or more of the mixers 108A, 108B, and in other embodiments, the LO can be in a different package.

Figure 6:
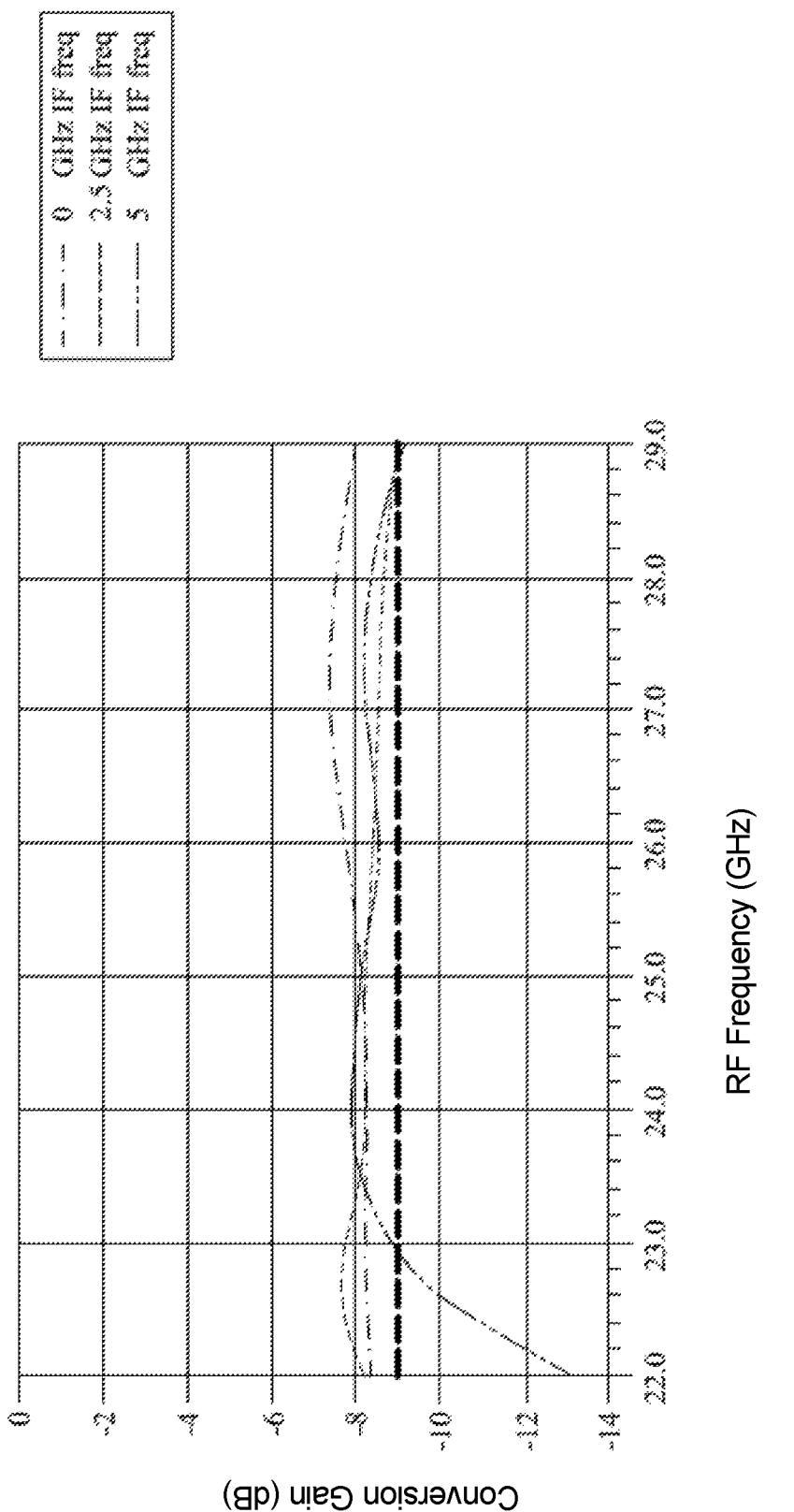
FIG. 6 is a simulation graph of an example single-ended mixer implemented according to the disclosed herein.

FIG. 6 is a simulation graph of an example single-ended mixer implemented according to the embodiments disclosed herein. The graph in FIG. 6 shows conversion gain over a range of RF frequency (from 22 GHz to 29 GHz) in three different cases of IF frequency (0 GHz, 2.5 GHz, and 5 GHz) for an example implementation of the technology disclosed herein. The example implementation here is an I/Q mixer having an operating range of 24-27 GHz and with RF and LO baluns designed in a 50 Ohm environment. In this example, a Lange coupler was used to provide a phase difference of 90 degrees between the I and Q channels, and a low-loss lumped Wilkinson combiner was used to combine the RF outputs. As illustrated in FIG. 6, this example I/Q mixer can achieve an average conversion gain of about −8 dB (or loss of 8 dB) with a minimum conversion loss of about 9 dB.

Figure 7:
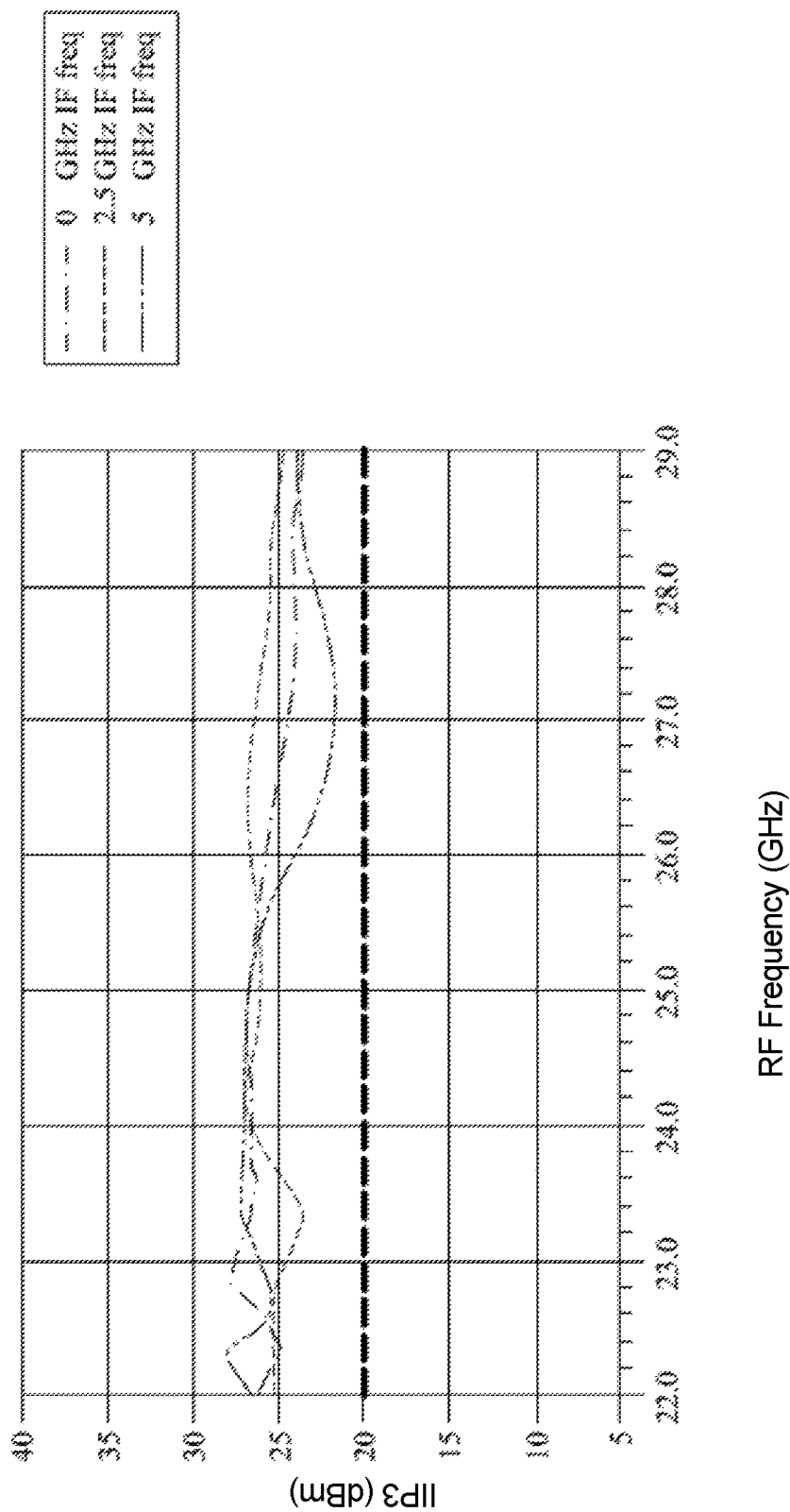
FIG. 7 is another simulation graph of the example single-ended mixer as in FIG. 6.

FIG. 7 is another simulation graph of the single-ended mixer discussed in connection with FIG. 6. The graph in FIG. 7 shows third-order input intercept point (IIP3) over a range of RF frequency (from 22 GHz to 29 GHz) in three different cases of IF frequency (0 GHz, 2.5 GHz, and 5 GHz). As illustrated in FIG. 7, this example I/Q mixer can achieve IIP3 of about 25 dBm with a minimum IIP3 of about 22 dBm.

Figure 8:
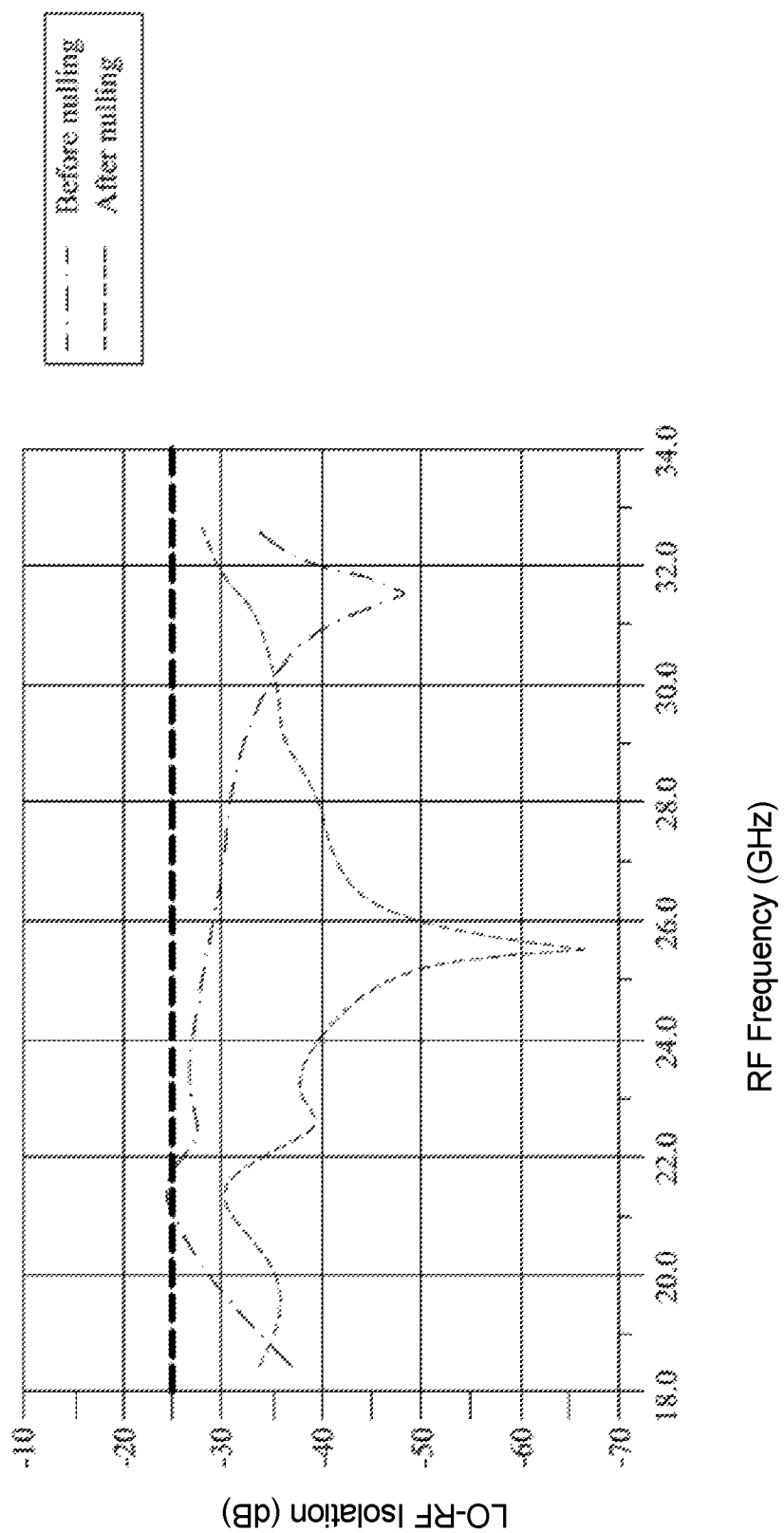
FIG. 8 is another simulation graph of the example single-ended mixer as in FIG. 6.

FIG. 8 is another simulation graph of the single-ended mixer discussed in connection with FIG. 6. The graph in FIG. 8 shows LO-RF isolation over a range of RF frequency (from 22 GHz to 29 GHz) before and after the LO nulling technique is used. As illustrated in FIG. 8, this example I/Q mixer implemented without the LO nulling can achieve the minimum LO-RF isolation of about 25 dB, while the LO nulling can improve the minimum LO-RF isolation of the example I/Q mixer to about 65 dBm.

Aspects of this disclosure can be implemented in various electronic devices. For instance, aspects of this disclosure can be implemented in any electronic device or electronic component that could benefit from a single-ended mixer. As an example, aspects of this disclosure can be implemented in any electronic device or electronic component with a transmitter, receiver, or transceiver that could benefit from a single-ended mixer. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus comprising:
  a mixer core configured to receive a differential input signal and a differential oscillator signal and to generate a differential signal across a first differential node and a second differential node, wherein the second differential node is configured to provide a single-ended output of the mixer core; and
  a termination impedance coupled to the first differential node of the mixer core,
  wherein the termination impedance is mismatched with a load impedance of a load coupled to the second differential node of the mixer core by at least one order of magnitude at a frequency of the single-ended output.

2. The apparatus of claim 1, further comprising one or more matching networks at differential oscillator signal nodes of the mixer core.

3. The apparatus of claim 2, wherein the one or more matching networks are arranged to compensate for mismatch on the first differential node resulting from the termination impedance being mismatched with the load impedance.

4. The apparatus of claim 1, wherein the termination impedance is physically located approximately as close as possible to the mixer core under layout rules for a process technology used to form the mixer core and the termination impedance.

5. The apparatus of claim 4, wherein the mixer core and the termination impedance are on a single die.

6. The apparatus of claim 1, wherein the termination impedance comprises a resistor having a resistance in a range from about 500Ω to 5000 Ω.

7. The apparatus of claim 1, wherein the second differential node of the mixer core is coupled to a high impedance connection, the high impedance connection having an impedance of at least 0.5 kΩ at a radio frequency.

8. The apparatus of claim 1, wherein the mixer core comprises a field effect transistor (FET) passive mixer, and wherein a distance between the termination impedance and a first FET of the mixer core is of the same magnitude as a distance between the first FET and a second FET of the mixer core.

9. The apparatus of claim 1, further comprising an input balun coupled to differential input signal nodes of the mixer core.

10. The apparatus of claim 1, further comprising a local oscillator balun, wherein the local oscillator balun is coupled to the differential oscillator signal nodes of the mixer core.

11. The apparatus of claim 1, wherein the load impedance of the second differential node of the mixer core is approximately 50 Ohms.

12. An in-phase/quadrature-phase (I/Q) mixer comprising a plurality of the apparatus of claim 1.

13. A passive mixer comprising:
  a plurality of field effect transistors configured to mix a differential input signal with a differential oscillator signal to generate a differential signal between a first node and a second node, the second node being coupled to a load having a load impedance; and
  a high termination impedance electrically coupled to the first node,
  wherein the second node is configured to provide a single-ended output of the passive mixer, and
  wherein the high termination impedance mismatches the load impedance and is at least 0.5 kΩ at a frequency of the single-ended output.

14. The passive mixer of claim 13, wherein the termination impedance is approximately as close as possible to the plurality of transistors under layout rules for a process technology used to form the plurality of transistors and the termination impedance.

15. The passive mixer of claim 13, wherein a distance between the termination impedance and a first field effect transistor of the plurality of field effect transistors is of the same magnitude as a distance between the first field effect transistor and a second field effect transistor of the plurality of field effect transistors.

16. The passive mixer of claim 13, wherein the passive mixer is a double-balanced field effect transistor (FET) ring mixer.

17. The passive mixer of claim 13 further comprising a matching network at differential nodes across which the differential oscillator signal is received, the matching network being arranged to compensate for mismatch on the first node resulting from the high termination impedance.

18. The passive mixer of claim 13, wherein the termination impedance is a resistor.

19. The passive mixer of claim 13, wherein the second node provides a single-ended output of the passive mixer and is coupled to a high impedance connection, the high impedance connection having an impedance of at least 0.5 kΩ at a radio frequency.

20. A method of manufacturing a mixer comprising:
forming a plurality of field effect transistors arranged as a mixer core configured to mix a differential input signal with a differential oscillator signal to generate a differential signal between a first node and a second node;
forming a high termination impedance adjacent to one of the plurality of field effect transistors; and
electrically connecting the high termination impedance to the first node,
wherein the mixer is configured to provide a single-ended output at the second node, the second node being coupled to a load having a load impedance, and
wherein the high termination impedance mismatches the load impedance and is at least one order of magnitude higher than 50Ω at a radio frequency.

21. The method of claim 20, wherein a distance between the high termination impedance and the one of the plurality of field effect transistors is of the same magnitude as a distance between the one of the plurality of field effect transistors and another of the plurality of field effect transistors.

* * * * *